United States Patent [19]

Kim

[11] Patent Number: 5,691,227

[45] Date of Patent: Nov. 25, 1997

[54] METHOD FOR FORMING CHARGE STORAGE ELECTRODES OF SEMICONDUCTOR DEVICE

[75] Inventor: Jeong Kim, Kyoungki-do, Rep. of Korea

[73] Assignee: Hyundai Electronics Industries Co., Ltd., Kyoungki-do, Rep. of Korea

[21] Appl. No.: 512,772

[22] Filed: Aug. 9, 1995

[30] Foreign Application Priority Data

Aug. 10, 1994 [KR] Rep. of Korea ............. 94-19688

[51] Int. Cl.$^6$ ................................. H01L 21/8242
[52] U.S. Cl. ..................... 437/60; 437/52; 437/919
[58] Field of Search ................. 437/47, 52, 60, 437/919

[56] References Cited

U.S. PATENT DOCUMENTS 5,449,635  9/1995  Jun ............................. 437/60
5,464,787  11/1995  Ryou .......................... 437/60

*Primary Examiner*—Tom Thomas
*Attorney, Agent, or Firm*—Morgan & Finnegan, L.L.P.

[57] ABSTRACT

A method for forming charge storage electrodes, involving the steps of patterning a first polysilicon layer in contact with a semiconductor substrate through charge storage electrode contact holes by use of a charge storage electrode mask, selectively growing an oxide film over a portion of interlayer insulating film exposed after the patterning such that the selectively-grown oxide film is upwardly protruded beyond the upper surface of the charge storage electrode mask, removing the charge storage electrode mask, forming a second polysilicon layer over the resulting structure, patterning the second polysilicon layer such that the second polysilicon layer has portions separated from one another, thereby forming charge storage electrodes each constituted by the pattern of the first polysilicon layer in contact with the semiconductor substrate through each corresponding charge storage electrode contact hole and the pattern of the second polysilicon layer disposed over the first polysilicon layer pattern while being in contact with the first polysilicon layer pattern, the second polysilicon layer pattern having bent portions. In accordance with the present invention, therefore, it is possible to obtain an increased surface area and to achieve improvements in yield and reliability of operation.

2 Claims, 5 Drawing Sheets

METHOD FOR FORMING CHARGE STORAGE ELECTRODES OF SEMICONDUCTOR DEVICE

BACKGROUND OF THE INVENTION

1. Field of the Invention

The present invention relates to a method for forming charge storage electrodes of a semiconductor device, and more particularly to a method for forming charge storage electrodes of a semiconductor device involving simple process steps capable of obtaining an increased surface area of the electrodes and achieving improvements in yield and operation reliability.

2. Description of the Prior Art

Recent high integration trend of semiconductor devices inevitably involves a reduction in cell dimension. However, such a reduction in cell dimension results in a difficulty to form capacitors having a sufficient capacitance. In order to obtain an increased capacitance in dynamic random access memory (DRAM) devices including one metal oxide semiconductor (MOS) transistor and one capacitor, in particular, there have been proposed the use of dielectric films made of a dielectric material exhibiting a high dielectric constant, the formation of thin dielectric layers, and the formation of capacitors having an increased surface area.

However, all of these methods have their own problems, respectively. Although various materials, such as $Ta_2O_5$, $TiO_2$ or $SrTiO_3$, have been proposed as the dielectric material exhibiting a high dielectric constant, their reliance and thin film characteristics have not been confirmed. For this reason, it is difficult to practically use such dielectric materials for semiconductor devices. On the other hand, the reduction in thickness of a dielectric layer results in damage of the dielectric layer, severely affecting the reliance of the capacitor.

In order to increase the surface area of the capacitor, various capacitor structures have also been proposed. They include a fin structure, a labyrinthine structure with a cylindrical or rectangular frame structure, and a structure with hemispherical grains of silicon at its storage electrode surface. In these capacitor structures, however, a residual is formed at edge portions of a peripheral circuit upon forming a required pattern because the topology between a cell region and a peripheral circuit region is increased. This residual causes the reliability of operation and the yield to be degraded.

SUMMARY OF THE INVENTION

Therefore, an object of the invention is to solve the above-mentioned problems involved in the prior art and to provide a method for forming charge storage electrodes of a semiconductor device capable of obtaining an increased surface area and achieving improvements in yield and reliability of operation by using simple process steps of patterning a polysilicon layer filling a charge storage electrode contact hole using a charge storage electrode mask, selectively over-growing an oxide film on the exposed portion of an interlayer insulating film disposed beneath the patterned polysilicon layer, removing the charge storage electrode mask, forming another polysilicon layer such that it surrounds the selectively-grown oxide film, and then carrying out subsequent process steps.

In accordance with the present invention, this object is accomplished by providing a method for forming charge storage electrodes of a semiconductor device, comprising the steps of: forming an interlayer insulating film over a semiconductor substrate; removing portions of the interlayer insulating film disposed above portions of the semiconductor substrate, each defined as a charge storage electrode contact, thereby forming charge storage electrode contact holes; forming a first polysilicon layer over the resulting structure obtained after the formation of the charge storage electrode contact holes such that the first polysilicon layer is in contact with the semiconductor substrate through the charge storage electrode contact holes; forming a charge storage electrode mask on the first polysilicon layer, thereby protecting portions of the first polysilicon layer respectively filling the charge storage electrode contact holes; removing portions of the first polysilicon layer not covered with the charge storage electrode mask, thereby partially exposing the interlayer insulating film; selectively growing an oxide film over each exposed portion of the interlayer insulating film such that the selectively-grown oxide film is upwardly protruded beyond the upper surface of the charge storage electrode mask; removing the charge storage electrode mask; forming a second polysilicon layer over the resulting structure obtained after the removal of the charge storage electrode; anisotropically full-etching the second polysilicon layer such that the second polysilicon layer has portions separated from one another, thereby forming charge storage electrodes each constituted by the first polysilicon layer pattern in contact with the semiconductor substrate through each corresponding charge storage electrode contact hole and the second polysilicon layer pattern disposed above the first polysilicon layer pattern while being in contact with the first polysilicon layer pattern, the second polysilicon layer pattern having bent portions.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1A to 1I illustrate a method for forming charge storage electrodes of a semiconductor device in accordance with the present invention.

Figure 1A:
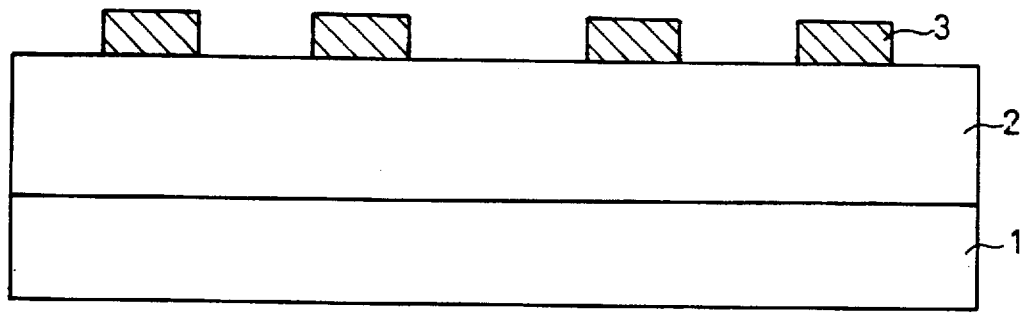
FIGS. 1A to 1I are sectional views respectively illustrating 2process steps for forming charge storage electrodes of a semiconductor device in accordance with the present invention.

In accordance with the present invention, a semiconductor substrate 1 is prepared and then a certain structure is formed over the semiconductor substrate 1 as shown in FIG. 1A. Although not shown, the structure may include an element-isolating insulating film, a gate oxide film and a series of word lines and diffusion regions. Over the structure, a first interlayer insulating film 2 is coated to provide a planarized upper surface of the structure. A series bit lines 3 are then formed on the first interlayer insulating film 2.

Figure 1B:
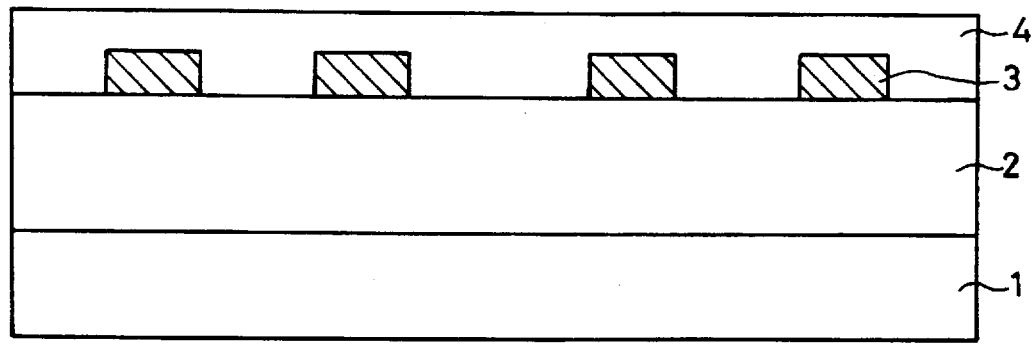

Over the entire upper Surface of the resulting structure, a second interlayer insulating film 4 is then formed, as shown in FIG. 1B. The second interlayer insulating film 4 is a layer having an insulation function and a planarization function and is made of a glass material, containing a silicon oxide, such as boro phospho silicate glass (BPSG).

Figure 1C:
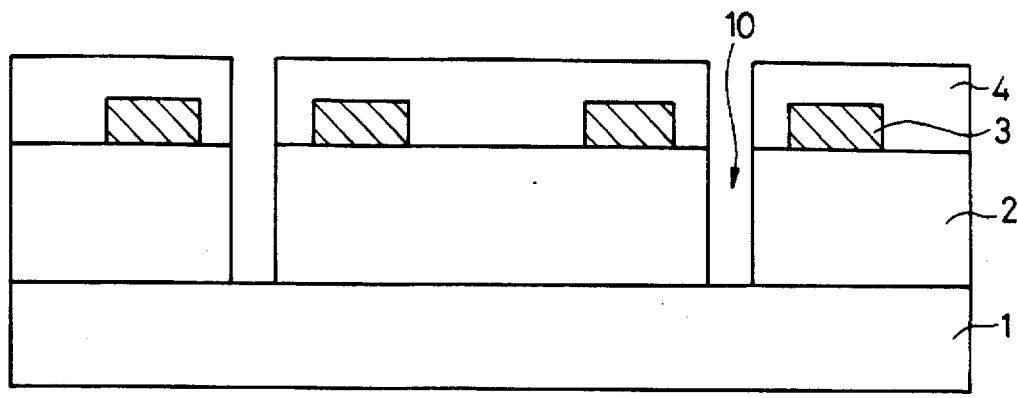
Figure 1D:
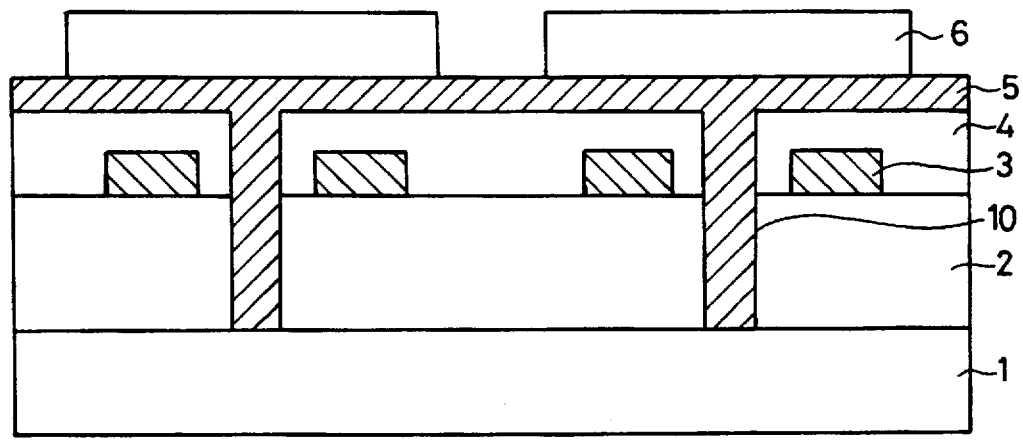

Thereafter, the second interlayer insulating film 4 and first interlayer insulating film 2 are sequentially removed at their portions disposed above portions of the semiconductor substrate 1, each defined as a charge storage electrode contact, using an anisotropic etch method, thereby forming charge storage electrode contact holes 10 as shown in FIG. 1C. Over the resulting structure, a first polysilicon layer 5 is then formed such that it is in contact with the semiconductor substrate 1 through the charge storage electrode contact holes 10. Subsequently, a first photoresist film pattern 6 is formed on the first polysilicon layer 5, as a charge storage electrode mask for protecting portions of the first polysilicon layer 5 respectively filling the charge storage electrode contact holes 10, as shown in FIG. 1D.

Figure 1E:
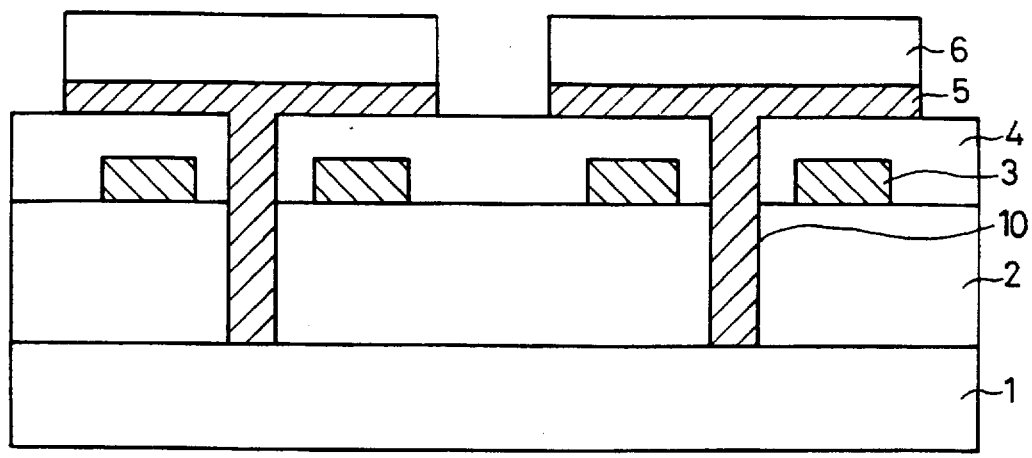
Figure 1F:
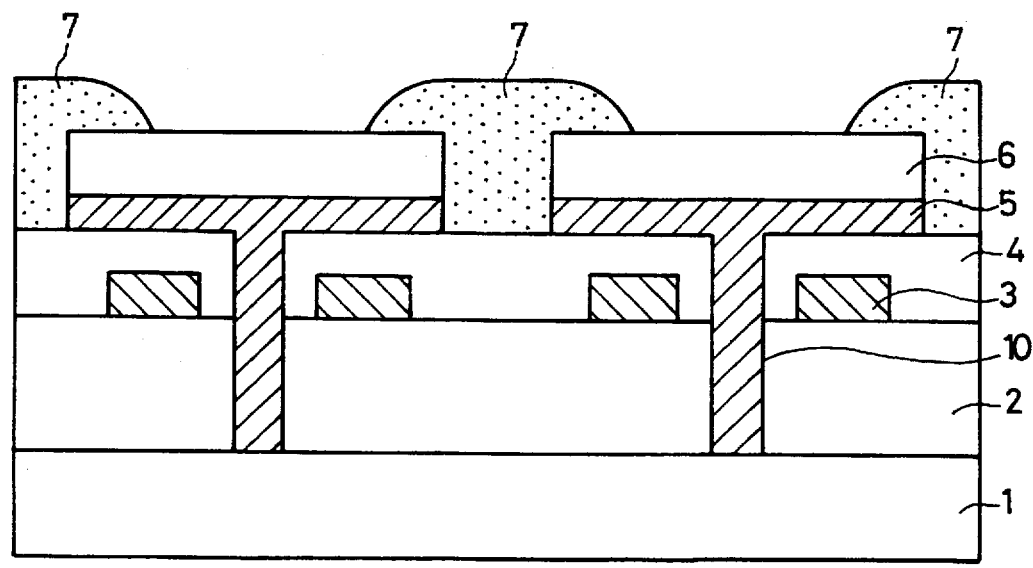

Portions of the first polysilicon layer 5 not covered with the first photoresist film pattern 6 are then removed, thereby partially exposing the second interlayer insulating film 4, as shown in FIG. 1E. Thereafter, an oxide film 7 is selectively grown over each exposed portion of the second interlayer insulating film 4 to a desired thickness, for example, a thickness that the selectively-grown oxide film 7 is upwardly protruded beyond the upper surface of the first photoresist film pattern 6, as shown in FIG. 1F.

Figure 1G:
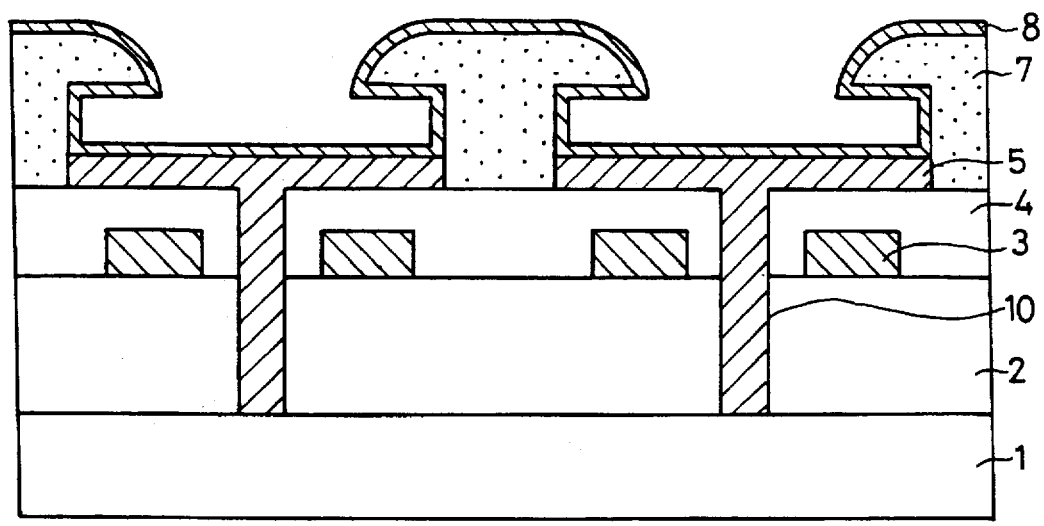

Subsequently, the first photoresist film pattern 6 is removed, thereby exposing the first polysilicon layer 5, as shown in FIG. 1G. Over the resulting structure, a second polysilicon layer 8 is then coated.

Figure 1H:
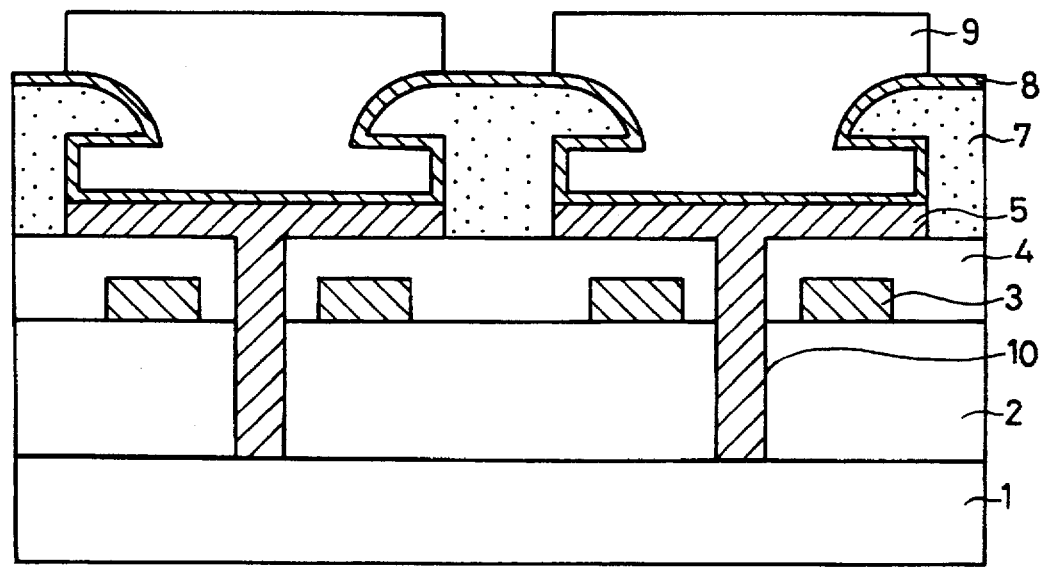

Using the same mask as the first photoresist film pattern 6, a second photoresist film pattern 9 is formed on the second polysilicon layer 8 such that only a portion of the second polysilicon layer 8 disposed over each selectively-grown oxide film 7 is exposed, as shown in FIG. 1H.

Figure 1I:
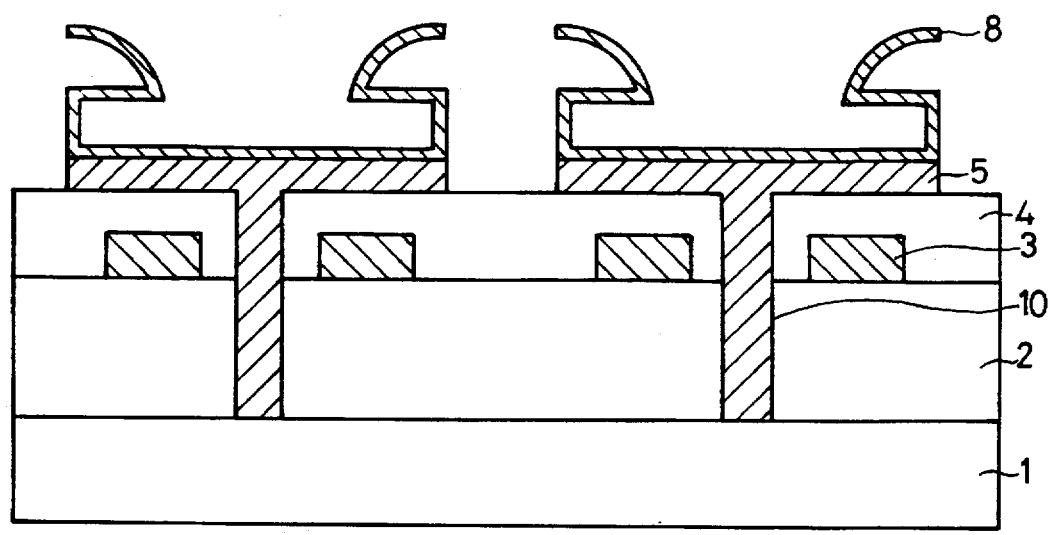

Portions of the second polysilicon layer 8 not covered with the second photoresist film pattern 9 are then removed so that the upper surface of each selectively-grown oxide film 7 is exposed. As a result, the portions of the second polysilicon layer 8 covered with the second photoresist film pattern 9 are separated from one another. This separation may be achieved using a full etch method without using the second photoresist film pattern 8. Thus, charge storage electrodes are obtained, each of which is constituted by the pattern of the first polysilicon layer 5 in contact with the semiconductor substrate 1 through each corresponding charge storage electrode contact hole 10 and the pattern of the second polysilicon layer 8 disposed over the first polysilicon layer pattern while being in contact with the first polysilicon layer pattern. The second polysilicon layer pattern has bent portions. After obtaining the charge storage electrodes, the second photoresist film pattern 9 and the selectively-grown oxide film 7 are removed, as shown in FIG. 1I.

As apparent from the above description, the present invention provides a method for forming charge storage electrodes, involving the steps of patterning a first polysilicon layer in contact with a semiconductor substrate through charge storage electrode contact holes by use of a charge storage electrode mask, selectively glowing an oxide film over a portion of interlayer insulating film exposed after the patterning such that the selectively-grown oxide film is upwardly protruded beyond the upper surface of the charge storage electrode mask, removing the charge storage electrode mask, forming a second polysilicon layer over the resulting structuze, patterning the second polysilicon layer such that the second polysilicon layer has portions separated from one another, thereby forming charge storage electrodes each constituted by the pattern of the first polysilicon layer in contact with the semiconductor substrate through each corresponding charge storage electrode contact hole and the pattern of the second polysilicon layer disposed over the first polysilicon layer pattern while being in contact with the first polysilicon layer pattern, the second polysilicon layer pattern having bent portions. In accordance with the present invention, therefore, it is possible to obtain an increased surface area and to achieve improvements in yield and reliability of operation.

Although the preferred embodiment of the invention has been disclosed for illustrative purposes, those skilled in the art will appreciate that various modifications, additions and substitutions are possible, without departing from the scope and spirit of the invention as disclosed in the accompanying claims.

What is claimed is:

1. A method for forming charge storage electrodes of a semiconductor device, comprising the steps of:

forming an interlayer insulating film over a semiconductor substrate;

removing portions of the interlayer insulating film disposed above portions of the semiconductor substrate, each defined as a charge storage electrode contact, thereby forming charge storage electrode contact holes;

forming a first polysilicon layer over the resulting structure obtained after the formation of the charge storage electrode contact holes such that the first polysilicon layer is in contact with the semiconductor substrate through the charge storage electrode contact holes;

forming a charge storage electrode mask on the first polysilicon layer, thereby protecting portions of the first polysilicon layer respectively filling the charge storage electrode contact holes;

removing portions of the first polysilicon layer not covered with the charge stolage electrode mask, thereby partially exposing the interlayer insulating film;

selectively growing an oxide film over each exposed portion of the interlayer insulating film such that the selectively-grown oxide film is upwardly protruded beyond the upper surface of the charge storage electrode mask;

removing the charge storage electrode mask;

forming a second polysilicon layer over the resulting structure obtained after the removal of the charge storage electrode;

anisotropically full-etching the second polysilicon layer such that the second polysilicon layer has portions separated flom one another, thereby forming charge storage electrodes each constituted by the first polysilicon layer pattern in contact with the semiconductor substrate through each corresponding charge storage electrode contact hole and the second polysilicon layer pattern disposed above the first polysilicon layer pattern while being in contact with the first polysilicon layer pattern, the second polysilicon layer pattern having bent portions.

2. The method in accordance with claim 1, wherein the second polysilicon layer is etched using a separate mask so that a portion thereof disposed over each of the selectively-grown oxide film is exposed.

* * * * *